United States Patent [19]
Matsuda et al.

[11] Patent Number: 5,869,854
[45] Date of Patent: Feb. 9, 1999

[54] SOLID-STATE IMAGING DEVICE AND METHOD OF MANUFACTURING THE SAME

[75] Inventors: Yuji Matsuda, Takatsuki; Masahiko Niwayama, Kyoto, both of Japan

[73] Assignee: Matsushita Electronics Corporation, Osaka, Japan

[21] Appl. No.: 950,601

[22] Filed: Oct. 16, 1997

Related U.S. Application Data

[63] Continuation of Ser. No. 509,606, Jul. 31, 1995, abandoned.

[30] Foreign Application Priority Data

Aug. 8, 1994 [JP] Japan .................................. 6-185884

[51] Int. Cl.$^6$ ........................ H01L 27/148; H01L 27/768
[52] U.S. Cl. ............................................ 257/223; 257/233
[58] Field of Search .................................. 257/222, 223, 257/230, 232, 233

[56] References Cited

U.S. PATENT DOCUMENTS

| | | | |
|---|---|---|---|
| 4,467,341 | 8/1984 | Suzuki | 257/230 |
| 4,717,945 | 1/1988 | Yusa et al. | 257/230 |
| 4,814,848 | 3/1989 | Akimoto et al. | 257/223 |
| 4,916,501 | 4/1990 | Thenoz et al. | 257/223 |
| 5,233,429 | 8/1993 | Jung | 358/213.23 |

OTHER PUBLICATIONS

"Solid–State Imagining Device and Applied Technology for Cameras Thereof", Torikeeps Co., Ltd., Sep. 30, 1988, p. 28, line 7 through p. 29, line 29.

*Primary Examiner*—Gene M. Munson
*Attorney, Agent, or Firm*—Morrison & Foerster LLP

[57] ABSTRACT

A solid-state imaging device provided here comprises a p-type semiconductor substrate, a p-type impurity layer formed thereon, a light-intercepting part formed inside said impurity layer for storing signal charges produced through incident light, and a n-type drain part formed in a region of the substrate excluding the light-intercepting part for discharging excess charges of the light-intercepting part. As a result, sensitivity characteristics on the long wavelength side can be improved, and miniaturization can be facilitated. An n-type buried drain part for discharging charges is formed under a transfer part via a p-type impurity layer. The readout side between the light-intercepting part and the transfer part is separated by a p-type readout control part which is installed to control threshold voltage (Vt), and the non-readout side is separated by a channel stopper. An insulating film is formed on the light-intercepting part and on the transfer part, and charges of the light-intercepting part are read out to the transfer part by the conductive-type electrode. For preventing dark current from arising, a p-type buried diffusion layer is formed at the interface of the light-intercepting part and the insulating film.

12 Claims, 7 Drawing Sheets

SOLID-STATE IMAGING DEVICE AND METHOD OF MANUFACTURING THE SAME

This application is a continuation of application Ser. No. 08/509,606, filed Jul. 31, 1995, now abandoned.

FIELD OF THE INVENTION

This invention relates to a solid-state imaging device used, for example, for a television camera and further relates to a method of manufacturing the same.

BACKGROUND OF THE INVENTION

A solid-state imaging device is a television camera comprising a photosensitive target surface which is formed by a CCD (charge coupled device) array. According to the principles of this device, a minor number of carriers among electron-hole pairs which correspond to the projected light intensity are stored inside a well of CCD electrode potential, and these stored charges are transferred to a non-photosensitive part of the CCD and further forwarded to an output device to be converted to video signals. The transfer is controlled to be in synchronization with a horizontal and a vertical retrace line period.

FIG. 11 is a cross-sectional view showing an element of a conventional solid-state imaging device. In FIG. 11, reference numeral 1 represents an n-type substrate; 2 represents a light-intercepting part; 3 represents a p-type buried diffusion layer; 4 represents a p-type impurity layer; 5 represents a transfer part; 6 represents a p-type readout control part; 7 represents a channel stopper; 8 represents an insulating film; 9 represents a conductive-type electrode; and 10 represents a p-type well.

The n-type substrate 1 has the p-type well 10 inside, and the p-type well 10 includes the n-type light-intercepting part 2 which produces and stores signal charges, the p-type impurity layer 4 which is positioned next to this light-intercepting part 2, and the n-type transfer part 5 which transfers signal charges stored inside this p-type impurity layer 4, wherein all these parts are formed in array. This structure is hereinafter referred to as a vertical OFD structure. The readout side between the light-intercepting part 2 and the transfer part 5 is separated by the p-type readout control part 6 which is installed to control threshold voltage (Vt), and the non-readout side is separated by the channel stopper 7. The insulating film 8 is formed on the light-intercepting part 2 and on the transfer part 5, and charges of the light-intercepting part 2 are read out to the transfer part 5 by the conductive-type electrode 9. Also, for the purpose of preventing dark current from arising, the p-type buried diffusion layer 3 is formed at the interface of the light-intercepting part 2 and the insulating film 8.

When formed in the vertical OFD structure, it is possible to discharge (excess) charges which are stored in the light-intercepting part 2 to the backside of the substrate by changing the substrate voltage.

FIG. 12 is a cross-sectional view showing an element of a conventional solid-state imaging device using a p-type substrate. In FIG. 12, reference numeral 2 represents a light-intercepting part; 3 represents a p-type buried diffusion layer; 4 represents a p-type impurity layer; 5 represents a transfer part; 6 represents a p-type readout control part; 7 represents a channel stopper; 8 represents an insulating film; 9 represents a conductive-type electrode; 11 represents a p-type substrate; 12 represents a horizontal excess charge control part; and 13 represents an n-type drain part.

The p-type substrate 11 includes the n-type light-intercepting part 2 which produces and stores signal charges, the p-type impurity layer 4 which is positioned next to this light-intercepting part 2, the n-type transfer part 5 which transfers signal charges stored inside this p-type impurity layer 4, and the n-type drain part 13 for discharging (excess) charges, and which is positioned next to the transfer part 5. This structure is hereinafter referred to as a horizontal OFD structure. The light-intercepting part 2 and the transfer part 5 are separated by the p-type readout control part 6 which is installed to control threshold voltage (Vt), and the transfer part 5 and the n-type drain part 13 are separated by the channel stopper 7, and furthermore, the light-intercepting part 2 and the n-type drain part 13 are separated by the horizontal excess charge control part 12 which is installed to control threshold voltage (Vt) for reading out (excess) charges. The insulating film 8 is formed on the light-intercepting part 2 and the transfer part 5, and also on the light-intercepting part 2 and the n-type drain part 13. Charges of the light-intercepting part 2 are read out to the transfer part 5 by the conductive-type electrode 9, and (excess) charges of the light-intercepting part 2 are read out to the n-type drain part 13. Furthermore, for the purpose of preventing dark current from arising, the p-type buried diffusion layer 3 is formed at the interface of the light-intercepting part 2 and the insulating film 8.

When formed in the horizontal OFD structure, it is possible to discharge (excess) charges which are stored in the light-intercepting part 2 to the n-type drain part 13 by changing the voltage of the conductive-type electrode 9 between the light-intercepting part 2 and the n-type drain part 13. See U.S. Pat. No. 5,233,429.

However, the vertical OFD structure in the conventional system has the problem of causing deterioration of sensitivity characteristics, because the signal charges produced by the absorption of long wavelength light in the substrate depth part of the light-intercepting part 2 are discharged to the side of the n-type substrate 1.

Furthermore, the problem with the horizontal OFD structure in the conventional system is that unit cell areas of the light-intercepting part 2 and the transfer part 5 etc. tend to become large in general since the n-type drain part 13 is needed for discharging (excess) charges. This is disadvantageous to miniaturization and is also accompanied by deterioration in the sensitivity and saturation characteristics along with the miniaturization.

SUMMARY OF THE INVENTION

An object of this invention is to solve the above-mentioned problems in the conventional systems by providing a solid-state imaging device formed in the structure which is capable of discharging excess charges stored in the light-intercepting part. Accordingly, sensitivity characteristics on the long wavelength side can be improved, and the miniaturization can be performed easily. Another object of this invention is to provide a method of manufacturing this solid-state imaging device.

In order to accomplish these and other objects and advantages, a first solid-state imaging device of this invention comprises at least a semiconductor substrate, a first conductive-type impurity layer formed thereon, and a light-intercepting part formed inside the impurity layer for storing signal charges produced through incident light. A second conductive-type drain part is provided in a region of the substrate that excludes the light-intercepting part for discharging excess charges of the light-intercepting part.

It is preferable that the light-intercepting part comprises a second conductive-type.

Furthermore, it is preferable that the substrate comprises a p-type semiconductor substrate, and that the light-intercepting part comprises an n-type semiconductor which produces and stores signals.

In addition, it is preferable that the first conductive-type impurity layer is present on the side of and apart from the light-intercepting part from the cross-sectional viewpoint, that a second conductive-type transfer part is present for transferring signal charges stored inside the first conductive-type impurity layer, and that a drain part is present under the transfer part.

Also, it is preferable that the readout side between the light-intercepting part and the transfer part is separated by a first conductive-type readout control part which is installed to control threshold voltage (Vt), and that the non-readout part is separated by a channel stopper.

It is preferable that an insulating film is formed on the light-intercepting part and the transfer part, wherein charges of the light-intercepting part are read out to the transfer part by a conductive-type electrode.

Furthermore, it is preferable that a first conductive-type buried diffusion layer is provided at the interface of the light-intercepting part and the insulating film for preventing dark current from arising.

In addition, it is preferable that a distance between the transfer part and the drain part is determined at least such that excess charges of the light-intercepting part can be discharged at the drain part and that punch-through can be prevented from occurring between the transfer part and the drain part. In this instance, the punch-through refers to a phenomenon in which a p-type impurity layer 24 becomes an air layer and a channel is formed between the transfer part and the drain part. Furthermore, the distance of not allowing punch-through from occurring between the transfer part and the drain part is preferably more than 200 nm.

Also, it is preferable that a bonding depth with the first conductive-type impurity layer is formed shallower than a bonding depth of the light-intercepting part. The bonding depth of the first conductive-type impurity layer is preferably formed about 10 to 2000 nm shallower than the bonding depth of the light-intercepting part.

It is preferable that a readout control part is provided between the light-intercepting part and the transfer part, and that a buried readout control part is provided between the light-intercepting part and the drain part.

Next, a second solid-state imaging device of this invention comprises at least a semiconductor substrate, a first conductive-type impurity layer formed thereon, and a light-intercepting part formed inside the impurity layer for storing signal charges produced through incident light, wherein the solid-state imaging device is provided with the first conductive-type impurity layer, an intercepted light transfer part which is formed inside the impurity layer to store signal charges produced by the incident light and to transfer stored signal charges, and a second conductive-type drain part which is formed in a region of the substrate that excludes the intercepted light transfer part for discharging excess charges of the intercepted light transfer part.

Preferably, the intercepted light transfer part comprises a second conductive-type. In addition, it is preferable that a distance between the intercepted light transfer part and the drain part is determined such that at least excess charges of the intercepted light transfer part can be discharged at the drain part, and that punch-through can be prevented from occurring between the intercepted light transfer part and the drain part.

Next, this invention includes a method of manufacturing a solid-state imaging device at least comprising a semiconductor substrate, a first conductive-type impurity layer formed thereon, and a light-intercepting part formed inside the impurity layer for storing signal charges produced through incident light. A first manufacturing method comprises the steps of forming a light-intercepting part which stores signal charges produced through incident light by injecting an impurity comprising a second conductive-type into the first conductive-type impurity layer, and forming a second conductive-type drain part in a region of the substrate that excludes the light-intercepting part, where the second conductive-type drain part discharges excess charges of the light-intercepting part.

In the above-mentioned manufacturing method, it is preferable that a step of forming a second conductive-type transfer part which transfers signal charges stored inside the light-intercepting part is performed between the steps of forming the light-intercepting part and the drain part.

Furthermore, it is preferable that the transfer part and the drain part are formed through ion injection using the same resist mask.

In addition, it is preferable that a readout control part is formed between the light-intercepting part and the transfer part after the drain part is formed, and that a control part is formed between the light-intercepting part and the drain part.

Also, it is preferable that the control part and the readout control part are formed through ion injection using the same resist mask.

Next, a second method of manufacturing a solid-state imaging device which comprises at least a semiconductor substrate, a first conductive-type impurity layer formed thereon, and a light-intercepting part formed inside the impurity layer for storing signal charges produced through incident light, comprises the steps of forming the first conductive-type impurity layer and a second conductive-type intercepted light transfer part which stores signal charges produced through incident light and transfers stored signal charges inside said first conductive-type impurity layer, and forming a second conductive-type drain part in a region of the substrate that excludes the intercepted light transfer part which discharges excess charges of the intercepted light transfer part.

Furthermore, it is preferable that a distance between the intercepted light transfer part and the drain part is determined at least such that excess charges of the intercepted light transfer part can be discharged at the drain part, and that punch-through can be prevented from occurring between the intercepted light transfer part and the drain part.

According to the solid-state imaging device and the manufacturing method thereof of the invention, the conductive-type drain part is formed under the transfer part with a predetermined distance therebetween for discharging excess charges of the light-intercepting part. As a result, excess charges stored in the light-intercepting part can be discharged, while sensitivity characteristics on the long wavelength side are improved, and miniaturization is performed easily.

In addition, according to the configuration of this invention, since the drain part comprising an (excess) charge discharging part is formed, for example, as the n-type buried drain part under the transfer part, the drain part is not necessary in a unit cell structure, which is different from the conventional horizontal OFD structure. As a result, the size per unit cell can be reduced as much as the size of the drain part, so that the aperture area on the light-intercepting part can be enlarged when the unit cell has the same size. Accordingly, physical incident light can be increased relative to a horizontal OFD structure, so that the sensitivity per unit cell area can be enhanced. By contrast, when the aperture area is determined to be the same, the chip area can be reduced as much as the size of the drain part, which is advantageous to miniaturization.

DETAILED DESCRIPTION OF THE INVENTION

This invention will be explained in detail by referring to the following examples and attached figures. The examples are illustrative and should not be construed as limiting the invention in any way.

EXAMPLE 1

A first embodiment of a solid-state imaging device in this invention will be explained by referring to a cross-sectional view of FIG. 1.

Figure 1:
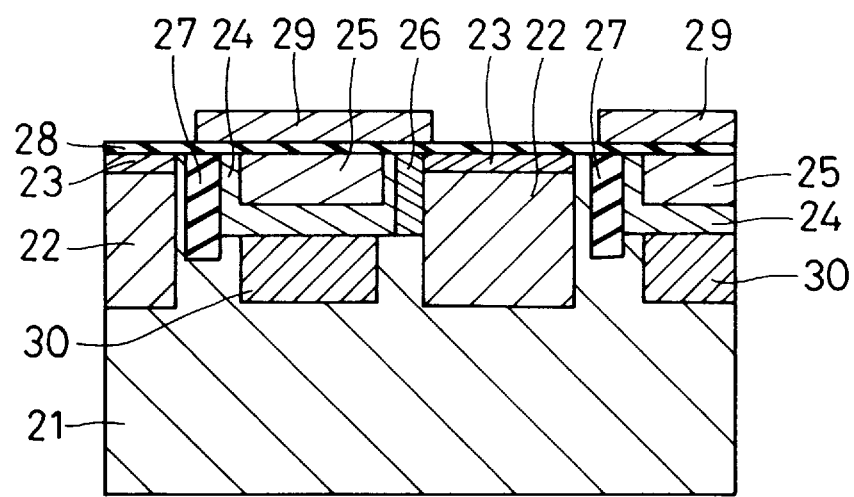
FIG. 1 is a cross-sectional view showing a solid-state imaging device in a first embodiment of this invention.

In FIG. 1, reference numeral 21 represents a p-type substrate; 22 represents a light-intercepting part; 23 represents a p-type buried diffusion layer; 24 represents a p-type impurity layer; 25 represents a transfer part; 26 represents a p-type readout control part; 27 represents a channel stopper; 28 represents an insulating film; 29 represents a conductive-type electrode; and 30 represents an n-type buried drain part.

The p-type substrate 21 includes the n-type light-intercepting part 22 which produces and stores signal charges, the p-type impurity layer 24 which is positioned next to the light-intercepting part 22, and the n-type transfer part 25 which transfers signal charges stored inside the p-type impurity layer 24. Furthermore, the n-type buried drain part 30 for discharging (excess) charges is formed under the transfer part 25 via the p-type impurity layer 24. The above-mentioned structure is hereinafter referred to as a BHOD (Buried Horizontal Overflow Drain) structure. The readout side between the light-intercepting part 22 and the transfer part 25 is separated by the p-type readout control part 26 which is installed to control threshold voltage (Vt), and the non-readout side is separated by the channel stopper 27. The insulating film 28 is formed on the light-intercepting part 22 and on the transfer part 25, and charges of the light-intercepting part 22 are read out to the transfer part 25 by the conductive-type electrode 29. Furthermore, for preventing dark current from arising, the p-type buried diffusion layer 23 is formed at the interface of the light-intercepting part 22 and the insulating film 28.

At this time, the transfer part 25 and the n-type buried drain part 30 are separated at least by a distance that enables discharging (excess) charges inside the light-intercepting part 22 at the n-type buried drain part 30, and also preventing punch-through from occurring when (excess) charges are discharged between the transfer part 25 and the n-type buried drain part 30. In particular, the distance between the transfer part 25 and the n-type buried drain part 30 is about 500 nm.

According to the BHOD structure, by changing the voltage applied to the n-type buried drain part 30, the (excess) charges stored in the light-intercepting part 22 can be discharged to the n-type buried drain part 30.

Figure 2:
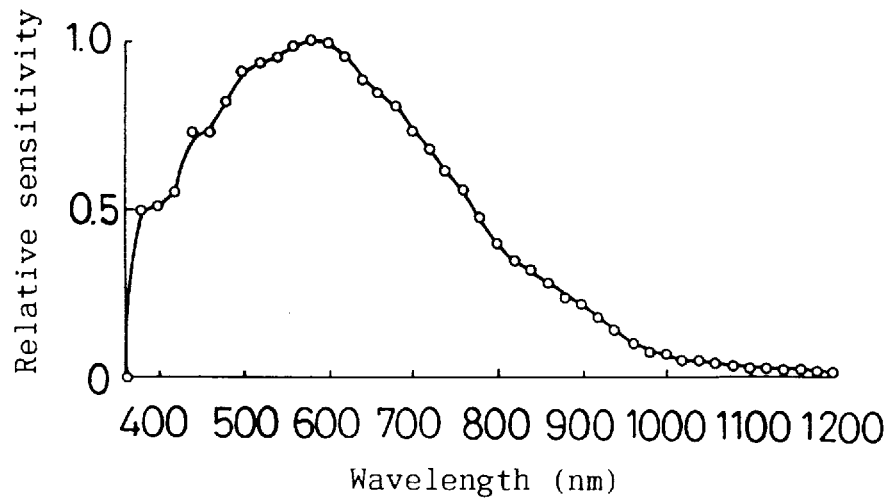
FIGS. 2 (a) and 2(b) are graphs showing a difference in wavelength sensitivity characteristics according to a different type of substrate impurity.
Figure 2:
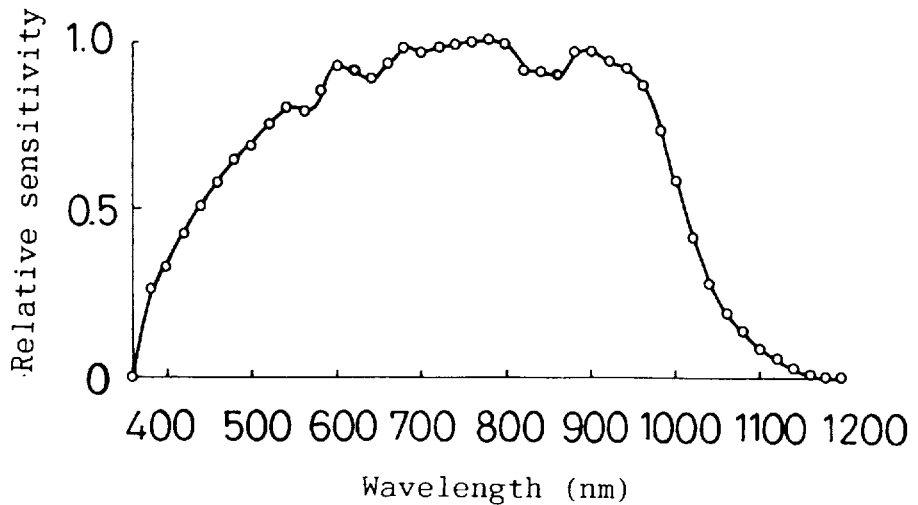

Furthermore, the use of the p-type substrate 21 in the BHOD structure enables diffusing of signal charges produced by absorption of long wavelength light not in the substrate direction, but toward the light-intercepting part 22 comprising an n-type area or toward the n-type buried drain part 30. As a result, sensitivity characteristics on the long wavelength side improve, as shown in FIG. 2 (b), that is, sensitivity improves particularly on the long wavelength side compared with the vertical OFD structure using an n-type substrate. In general, sensitivity of the light-intercepting part 22 can be obtained with the following formula (Formula 1) in which the sensitivity is attained as a definite integral value of the sensitivity (vertical axis) with each wavelength shown in FIGS. 2 (a), 2 (b) against a wavelength inside a visible light area (horizontal axis).

$$Qs = \Delta x \Delta y t f_{\lambda 1}{}^{\lambda 2} H \lambda \eta(\lambda) \, (hc/\lambda) d\lambda \qquad \text{(Formula 1)}$$

In this formula, $\Delta x \Delta y$ represents an aperture area of a light-intercepting part; $\eta\,(\lambda)$ represents a quantum efficiency; t represents a storage time; c represents a light speed; $\lambda$ represents a light wavelength; h represents Planck's constant; $H\lambda$ represents a light strength; and $hc/\lambda$ represents a photon energy.

When formed in the BHOD structure, sensitivity characteristics with the same aperture area improve about 1.5 times compared with the vertical OFD structure.

In addition, according to the BHOD structure, since the drain part comprising an (excess) charge discharging part is formed as the n-type buried drain part 30 under the transfer part 25, the drain part is not needed in a unit cell structure, which is different from the horizontal OFD structure. As a result, the size per unit cell can be reduced as much as the size of the drain part, so that the aperture area on the light-intercepting part can be enlarged when the unit cell has the same size. Accordingly, physical incident light can be increased than with the horizontal OFD structure, so that the sensitivity per unit cell area can be enhanced. On the contrary, when the aperture area is determined to be the same, the chip area can be reduced as much as the size of the drain part, which is advantageous to miniaturization.

EXAMPLE 2

A second embodiment of a solid-state imaging device in this invention will be explained by referring to a cross-sectional view of FIG. 3.

Figure 3:
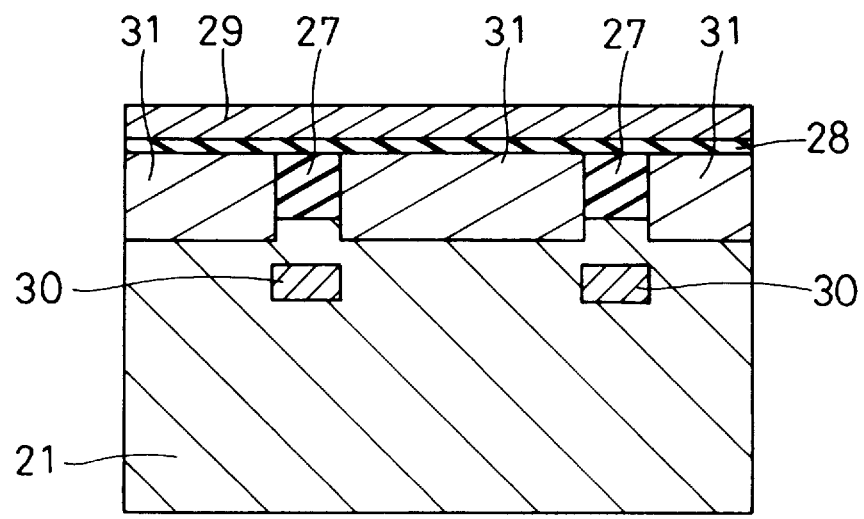
FIG. 3 is a cross-sectional view showing a solid-state imaging device in a second embodiment of this invention.

In FIG. 3, reference numeral 21 represents a p-type substrate; 27 represents a channel stopper; 28 represents an insulating film; 29 represents a conductive-type electrode; 30 represents an n-type buried drain part; and 31 represents an intercepted light transfer part.

The p-type substrate 21 includes the n-type intercepted light transfer part 31 which produces, stores, and transfers signal charges, and the channel stopper 27 which is positioned next to the intercepted light transfer part 31. Furthermore, the n-type buried drain part 30 for discharging (excess) charges is formed under the channel stopper 27. The insulating film 28 is formed on the intercepted light transfer part 31 and also on the channel stopper 27, and charges of the intercepted light transfer part 31 are transferred by the conductive-type electrode 29.

At this time, the intercepted light transfer part 31 and the n-type buried drain part 30 are separated at least by a distance that enables discharging (excess) charges of the intercepted light transfer part 31 at the n-type buried drain part 30, and also preventing punch-through from occurring when (excess) charges are discharged between the intercepted light transfer part 31 and the n-type buried drain part 30.

According to the BHOD structure, by changing the applied voltage to the n-type buried drain part 30, the (excess) charges stored at the intercepted light transfer part 31 can be discharged to the n-type buried drain part 30.

Furthermore, the use of the p-type substrate 21 in the BHOD structure enables diffusing signal charges produced by absorption of long wavelength light not in the substrate direction, but toward the intercepted light transfer part 31 comprising an n-type area or toward the n-type buried drain part 30. As a result, sensitivity characteristics on the long wavelength side improve, as shown in FIG. 2 (b), that is, sensitivity improves particularly on the long wavelength side compared with the vertical OFD structure using an n-type substrate. In general, sensitivity of the intercepted light transfer part can be obtained with Formula 1 in which the sensitivity is attained as a definite integral value of the sensitivity (vertical axis) with each wavelength shown in FIGS. 2 (a), 2 (b) against a wavelength inside a visible light area (horizontal axis). When formed in the BHOD structure, sensitivity characteristics with the same cell area improve about 1.5 times compared with the vertical OFD structure.

In addition, according to the BHOD structure, since the drain part comprising an (excess) charge discharging part is formed as the n-type buried drain part 30 under the intercepted light transfer part 31, the drain part is not needed in a unit cell structure, which is different from the horizontal OFD structure. As a result, the size per unit cell can be reduced as much as the size of the drain part, so that the aperture area on the light-intercepting part can be enlarged when the unit cell has the same size. Accordingly, physical incident light can be increased relative to the horizontal OFD structure, so that the sensitivity per unit cell area can be enhanced.

EXAMPLE 3

A third embodiment of a solid-state imaging device in this invention will be explained by referring to a cross-sectional view of FIG. 4.

Figure 4:
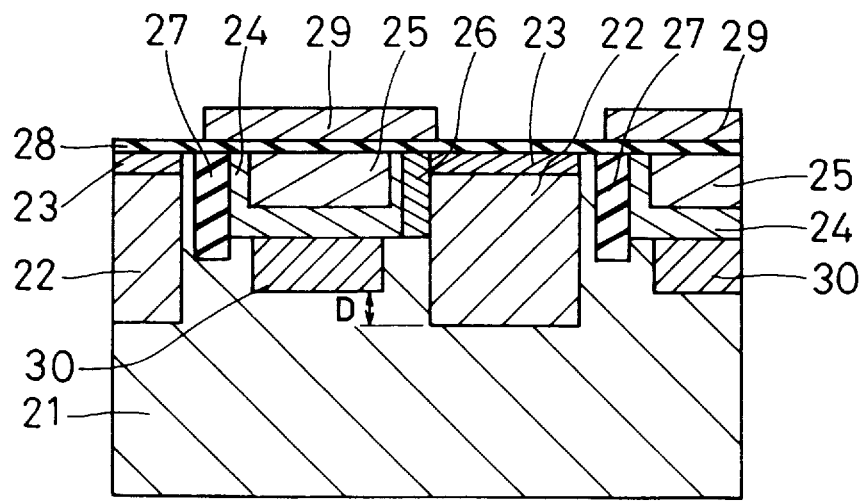
FIG. 4 is a cross-sectional view showing a solid-state imaging device in a third embodiment of this invention.

In FIG. 4, reference numeral 21 represents a p-type substrate; 22 represents a light-intercepting part; 23 represents a p-type buried diffusion layer; 24 represents a p-type impurity layer; 25 represents a transfer part; 26 represents a p-type readout control part; 27 represents a channel stopper; 28 represents an insulating film; 29 represents a conductive-type electrode; and 30 represents an n-type buried drain part.

The p-type substrate 21 includes the n-type light-intercepting part 22 which produces and stores signal charges, the p-type impurity layer 24 which is positioned next to the light-intercepting part 22, and the n-type transfer part 25 which transfers signal charges stored inside the p-type impurity layer 24. Furthermore, the n-type buried drain part 30 for discharging (excess) charges is formed under the transfer part 25 via the p-type impurity layer 24.

At this time, the transfer part 25 and the n-type buried drain part 30 are separated at least by a distance that enables discharging (excess) charges of the light-intercepting part 22 at the n-type buried drain part 30, and also prevents punch-through from occurring when (excess) charges are discharged between the transfer part 25 and the n-type buried drain part 30. At the same time, as for depths (D) of bonding between the light-intercepting part 22 and the p-type substrate 21, and between the n-type buried drain part 30 and the p-type substrate 21, the bonding depth between the light-intercepting part 22 and the p-type substrate 21 is made to become larger. The bonding depth (D) is preferably from 1000 to 3000 nm.

The readout side between the light-intercepting part 22 and the transfer part 25 is separated by the p-type readout control part 26 that is installed to control threshold voltage (Vt), and the non-readout side is separated by the channel stopper 27. The insulating film 28 is formed on the light-intercepting part 22 and on the transfer part 25, and charges of the light-intercepting part 22 are read out to the transfer part 25 by the conductive-type electrode 29. Furthermore, for preventing dark current from arising, the p-type buried diffusion layer 23 is formed at the interface of the light-intercepting part 22 and the insulating film 28.

In the BHOD structure, it is already mentioned that signal charges which are produced by absorption of long wavelength light are not diffused in the substrate direction, but toward the light-intercepting part 22 comprising an n-type area or toward the n-type buried drain part 30. In addition to this structure, by forming the bonding depth between the light-intercepting part 22 and the p-type substrate 21 to become larger than the bonding depth between the n-type buried drain part 30 and the p-type substrate 21, the possibility of diffusing the signal charges produced by the absorption of long wavelength light toward the n-type buried drain part 30 increases.

This indicates that sensitivity characteristics can be improved even more by forming the bonding depth between the light-intercepting part 22 and the p-type substrate 21 to become larger than the bonding depth between the n-type buried drain part 30 and the p-type substrate 21.

EXAMPLE 4

A fourth embodiment of a solid-state imaging device in this invention will be explained by referring to a cross-sectional view of FIG. 5.

Figure 5:
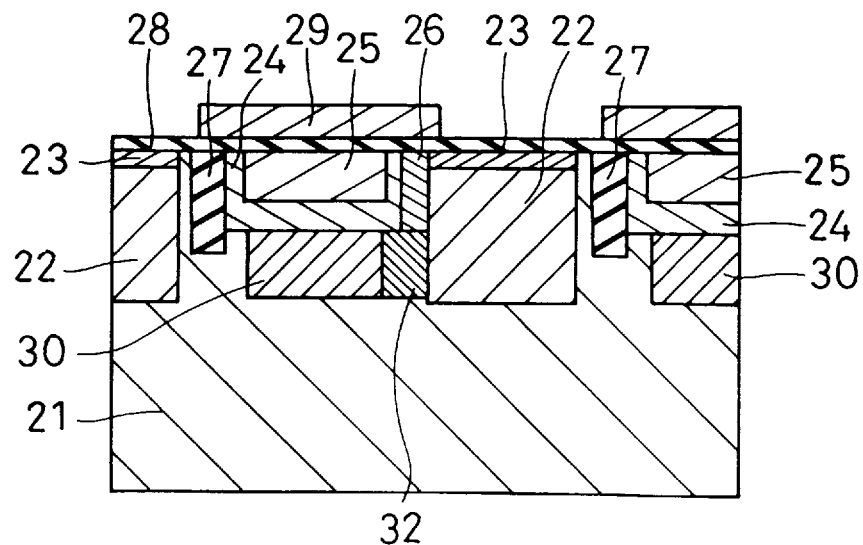
FIG. 5 is a cross-sectional view showing a solid-state imaging device in a fourth embodiment of this invention.

In FIG. 5, reference numeral 21 represents a p-type substrate; 22 represents a light-intercepting part; 23 represents a p-type buried diffusion layer; 24 represents a p-type impurity layer; 25 represents a transfer part; 26 represents a p-type readout control part; 27 represents a channel stopper;

28 represents an insulating film; 29 represents a conductive-type electrode; 30 represents an n-type buried drain part; and 32 represents a buried p-type readout control part.

The p-type substrate 21 includes the n-type light-intercepting part 22 which produces and stores signal charges, the p-type impurity layer 24 which is positioned next to the light-intercepting part 22, and the n-type transfer part 25 which transfers signal charges stored inside the p-type impurity layer 24. Furthermore, the n-type buried drain part 30 for discharging (excess) charges is formed under the transfer part 25 via the p-type impurity layer 24. The readout side between the light-intercepting part 22 and the transfer part 25 is separated by the p-type readout control part 26 which is installed to control threshold voltage (Vt), and the non-readout side is separated by the channel stopper 27. Also, the light-intercepting part 22 and the n-type buried drain part 30 are separated by the buried p-type readout control part 32 which is installed to control threshold voltage (Vt) for reading out excess charges. The insulating film 28 is formed on the light-intercepting part 22 and on the transfer part 25, and charges of the light-intercepting part 22 are read out to the transfer part 25 by the conductive-type electrode 29. Furthermore, for preventing dark current from arising, the p-type buried diffusion layer 23 is formed at the interface of the light-intercepting part 22 and the insulating film 28.

By forming the buried p-type readout control part 32 for controlling the threshold voltage (Vt) to read out (excess) charges between the light-intercepting part 22 and the n-type buried drain part 30, the separation is ensured. Also, the amount of handling charge in the light-intercepting part 22 and also in the n-type buried drain part 30 can be increased.

EXAMPLE 5

A method of manufacturing a solid-state imaging device of this invention will now be explained in one embodiment by referring to FIGS. 6 to 10, which are cross-sectional views showing the steps.

In FIGS. 6 to 10, reference numeral 21 represents a p-type substrate; 22 represents a light-intercepting part; 23 represents a p-type buried diffusion layer; 24 represents a p-type impurity layer; 25 represents a transfer part; 26 represents a p-type readout control part; 27 represents a channel stopper; 28 represents an insulating film; 29 represents a conductive-type electrode; 30 represents an n-type buried drain part; 32 represents a buried p-type readout control part; and 33 represents a resist mask.

Figure 6:
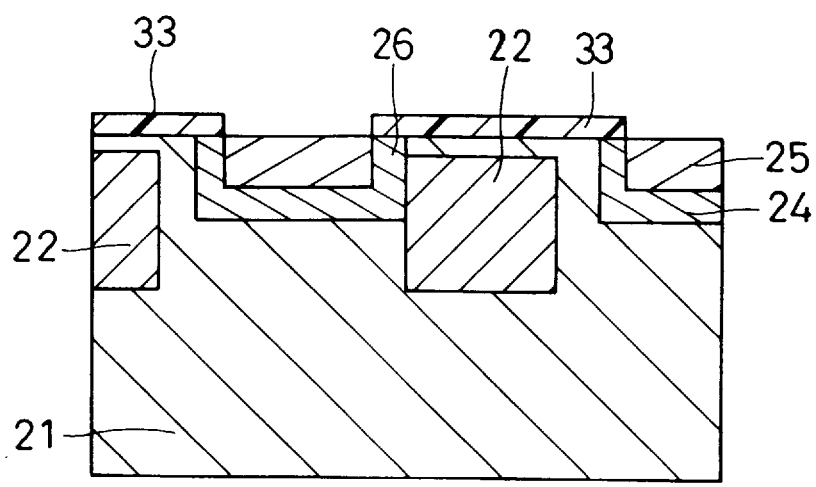
FIG. 6 is a cross-sectional view showing a step in an embodiment of a method of manufacturing a solid-state imaging device of this invention.

First, as shown in FIG. 6, the light-intercepting part 22 is formed by injecting an n-type impurity into the p-type substrate 21. Then, after the p-type impurity layer 24 is formed next to the light-intercepting part 22 through injection, the resist mask 33 is used to form the transfer part 25 by injecting an n-type impurity into the p-type impurity layer 24.

Figure 7:
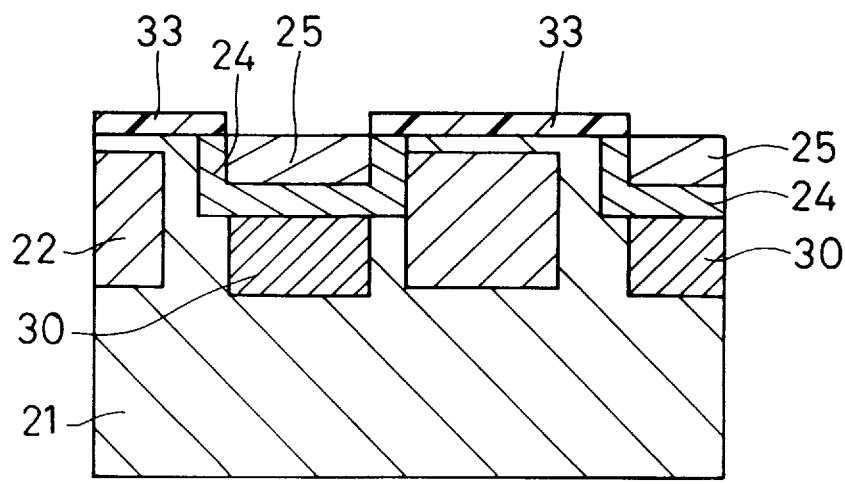
FIG. 7 is a cross-sectional view showing a step in a method of manufacturing a solid-state imaging device in one embodiment of this invention.

Next, as shown in FIG. 7, the resist mask 33 which formed the transfer part 25 is used in the same condition, and by applying higher acceleration energy than that for forming the transfer part 25, the n-type buried drain part 30 is formed through ion injection in an area that is deeper than the transfer part 25 and the p-type impurity layer 24.

Figure 8:
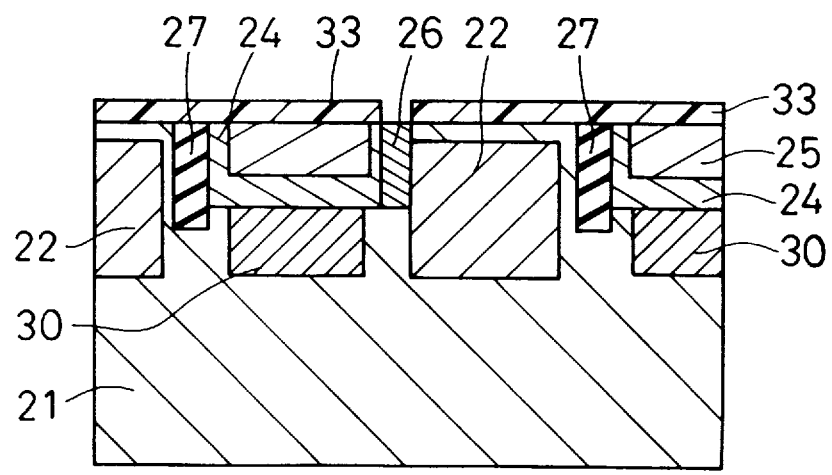
FIG. 8 is a cross-sectional view showing a step in a method of manufacturing a solid-state imaging device in one embodiment of this invention.

Thereafter, as shown in FIG. 8, the channel stopper 27 is formed on the non-readout side between the light-intercepting part 22 and the transfer part 25, and the p-type readout control part 26 is formed through ion injection using the resist mask 33 on the readout side between the light-intercepting part 22 and the transfer part 25.

Figure 9:
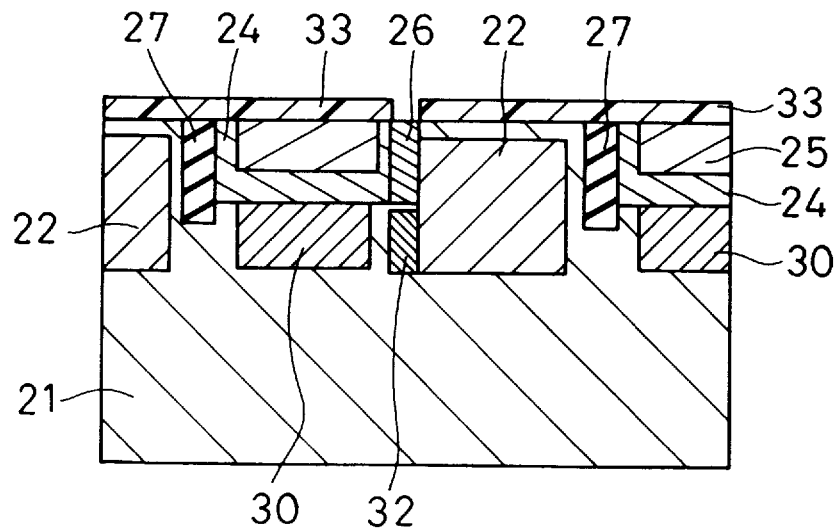
FIG. 9 is a cross-sectional view showing a step in a method of manufacturing a solid-state imaging device in one embodiment of this invention.

Subsequently, as shown in FIG. 9, the resist mask 33 which formed the p-type readout control part 26 is used in the same condition, and by applying higher acceleration energy than that for forming the p-type readout control part 26, the buried p-type readout control part 32 is formed through ion injection in an area which is deeper than the p-type readout control part 26 and also between the light-intercepting part 22 and the n-type buried drain part 30.

Figure 10:
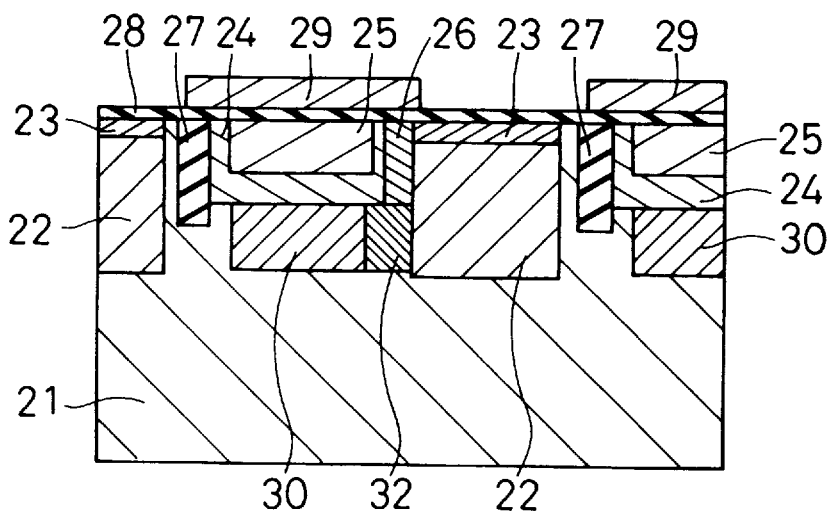
FIG. 10 is a cross-sectional view showing a step in a method of manufacturing a solid-state imaging device in one embodiment of this invention.
Figure 11:
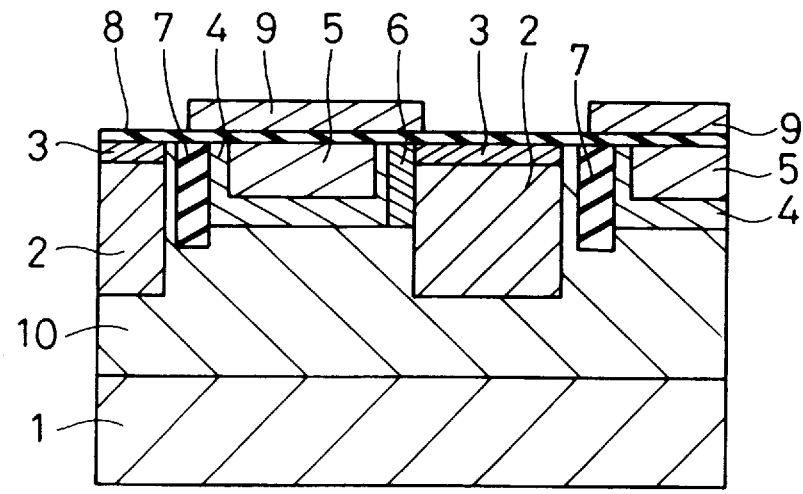
FIG. 11 is a cross-sectional view showing a conventional solid-state imaging device.
Figure 12:
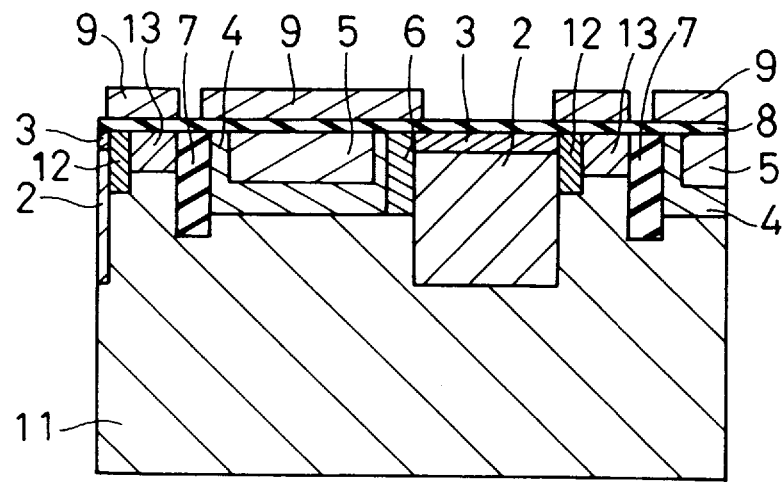
FIG. 12 is a cross-sectional view showing a conventional solid-state imaging device using a p-type substrate.

Then, as shown in FIG. 10, after the insulating film 28 is formed, the conductive-type electrode 29 is formed so that charges of the light-intercepting part 22 can be read out to the transfer part 25. Furthermore, for preventing dark current from arising, the p-type buried diffusion layer 23 is formed at the interface of the light-intercepting part 22 and the insulating film 28.

The above-mentioned manufacturing method enables eliminating the masking step at the time when the n-type buried drain part 30 and the buried p-type readout control part 32 are formed.

The embodiments of this invention were explained by using the substrate of the p-type and the light-intercepting part, the transfer part, and the buried drain part in the n-type area. However, the same effects can be attained by using a substrate of the n-type and the light-intercepting part, the transfer part, and the buried drain part in the p-type area.

Furthermore, the embodiments of this invention were explained by using the substrate of the p-type and the light-intercepting part, the transfer part, and the buried drain part in the n-type area. However, the same effects can be attained by using a p-type MOS photodiode for the light-intercepting part.

In addition, the embodiments of this invention were explained by using the p-type readout control part between the light-intercepting part and the transfer part. However, as far as the readout part is concerned, any readout structure can be used to attain the same effects.

The embodiments of this invention were explained by forming the n-type buried drain part under the transfer part via the p-type impurity layer. However, the same effects can be attained by forming the n-type buried drain part in an area other than under the light-intercepting part, for example, by forming it in array under the channel stopper.

Also, FIGS. 1 to 10, which were used for explaining this invention, were schematic views serving for understanding this invention. Therefore, sizes of each structural component in the figures as well as size ratios between each structural component are schematically described. This invention is not limited to the examples shown in the figures.

With regard to the explanation of the manufacturing method of this invention, the order of steps described is only one example. The order of forming each structural component is not limited to the order explained in this invention.

Furthermore, concerning the explanation of the manufacturing method of this invention, injection was used as a method of forming each structural component. However, the same effects can be confirmed by using other conventional methods such as thermal diffusion.

The invention may be embodied in other forms without departing from the spirit or essential characteristics thereof. The embodiments disclosed in this application are to be considered in all respects as illustrative and not as restrictive. The scope of the invention is indicated by the appended claims rather than by the foregoing description, and all changes which come within the meaning and range of equivalency of the claims are intended to be embraced therein.

What is claimed is:

1. A solid-state imaging device, comprising a p-type semiconductor substrate, wherein
   (i) a light-intercepting part is formed inside said semiconductor substrate for storing signal charges produced through incident light,
   (ii) an n-type drain part is formed inside said semiconductor substrate that excludes said light-intercepting part, and said drain part discharges excess charges of said light-intercepting part,
   (iii) an n-type transfer part being present to the side of, and apart from, the light-intercepting part from a cross-sectional viewpoint, said transfer part is present for transferring the stored signal charges, and
   (iv) said drain part is only present in a position completely under said transfer part.

2. The solid-state imaging device as claimed in claim 1, wherein said light-intercepting part comprises an n-type light-intercepting part.

3. The solid-state imaging device as claimed in claim 1, wherein the light-intercepting part comprises an n-type semiconductor which produces and stores signal charges.

4. The solid-state imaging device as claimed in claim 1, wherein a distance between the transfer part and the drain part is determined at least such that excess charges of the light-intercepting part can be discharged at said drain part and punch-through can be prevented from occurring between said transfer part and said drain part.

5. The solid-state imaging device as claimed in claim 1, wherein a readout control part is provided between the light-intercepting part and the transfer part, and a buried readout control part is provided between said light-intercepting part and the drain part.

6. The solid-state imaging device as claimed in claim 1, further comprising a p-type readout control part between the light-intercepting part and the transfer part, wherein the readout control part is installed to control threshold voltage (Vt).

7. The solid-state imaging device as claimed in claim 1, wherein an insulating film is formed on the light-intercepting part and on the transfer part, wherein charges of the light-intercepting part are read out to the transfer part by an electrode.

8. The solid-state imaging device as claimed in claim 1, wherein a p-type buried diffusion layer is provided at the interface of the light intercepting part and an insulating film for preventing dark current from arising.

9. The solid-state imaging device as claimed in claim 1, wherein a depth of the transfer part is formed shallower than a depth of the light-intercepting part.

10. A solid-state imaging device, comprising
    a p-type semiconductor substrate,
    a light-intercept-transfer part formed inside the semiconductor substrate for storing signal charges produced through incident light and for transferring the stored signal charges, and
    an n-type drain part which is formed inside said semiconductor substrate that excludes said light-intercept-transfer part for discharging excess charges of said light-intercept-transfer part, wherein said drain part is only present in a position completely under said light-intercept-transfer part.

11. The solid-state imaging device as claimed in claim 10, wherein the light-intercept-transfer part comprises an n-type light-intercept-transfer part.

12. The solid-state imaging device as claimed in claim 10, wherein a distance between the light-intercept-transfer part and the drain part is determined such that excess charges of said light-intercept-transfer part can be discharged at the drain part while punch-through is prevented from occurring between said light-intercept-transfer part and said drain part.

* * * * *